United States Patent [19]
Face

[11] Patent Number: 5,439,877
[45] Date of Patent: Aug. 8, 1995

[54] PROCESS FOR DEPOSITING HIGH TEMPERATURE SUPERCONDUCTING OXIDE THIN FILMS

[75] Inventor: Dean W. Face, Wilmington, Del.

[73] Assignee: E. I. Du Pont de Nemours and Company, Wilmington, Del.

[21] Appl. No.: 217,036

[22] Filed: Mar. 24, 1994

Related U.S. Application Data

[63] Continuation-in-part of Ser. No. 894,983, Jun. 8, 1992, abandoned, which is a continuation of Ser. No. 624,435, Dec. 7, 1990, abandoned.

[51] Int. Cl.$^6$ ............................................. C23C 14/34
[52] U.S. Cl. ..................... 505/475; 505/473; 505/480; 505/730; 505/731; 427/62; 427/126.3; 204/192.24
[58] Field of Search ............... 505/475, 473, 480, 731, 505/730; 427/62, 63, 126.3; 204/192.24

[56] References Cited

U.S. PATENT DOCUMENTS

| | | | |
|---|---|---|---|
| 4,598,039 | 7/1986 | Fischer et al. | 430/323 |
| 4,913,790 | 8/1990 | Narita et al. | 204/192.13 |
| 4,940,842 | 7/1990 | Schultz et al. | 505/1 |
| 5,206,216 | 4/1993 | Yoshida | 505/1 |

FOREIGN PATENT DOCUMENTS

| | | |
|---|---|---|
| 0359411 | 3/1990 | European Pat. Off. . |
| 0435765 | 7/1991 | European Pat. Off. . |
| 2247384 | 10/1990 | Japan . |
| 3097870 | 7/1991 | Japan . |

OTHER PUBLICATIONS

Talvacchio, J. et al, *SPIE Proc.*, 1292, 1990, pp. 1–11.
Mankiewich, P. M. et al, *Appl. Phys. Lett.*, 51(21), 1–10, Nov. 23, 1987.
Simon, R. *SPIE*, 1187, pp. 1–10, 1989.
Simon, R. *Solid State Technology*, pp. 141–146, Sep. 1989.
Yonezawa et al, Extended Abstracts of the 20th Conf. on Solid State Devices & Materials, Aug. 1988, pp. 435–438.
Nuss et al, *Appl. Phys. Lett.*, 54(22), pp. 2265–2267, May 29, 1989.
Lee, et al, *Appl. Phys. Lett.*, 57(19), pp. 2019–2021, Nov. 5, 1990.
Withers et al, *Solid State Technology*, 33(8), pp. 83–87, Aug. 1990.

Primary Examiner—Roy V. King

[57] ABSTRACT

In-situ process are provided for 1) depositing on a substrate a crystalline thin film of a high temperature superconducting oxide by exposing the back surface of the substrate, i.e., the surface of the substrate opposite the surface on which the thin film is deposited, to radiation from a direct radiant heat source, thereby heating the substrate to the desired growth temperature, and maintaining the radiation and thereby the desired growth temperature during the deposition of the thin film, and 2) depositing a crystalline thin film of high temperature superconducting oxides onto both the front and back surfaces of a substrate.

16 Claims, 3 Drawing Sheets

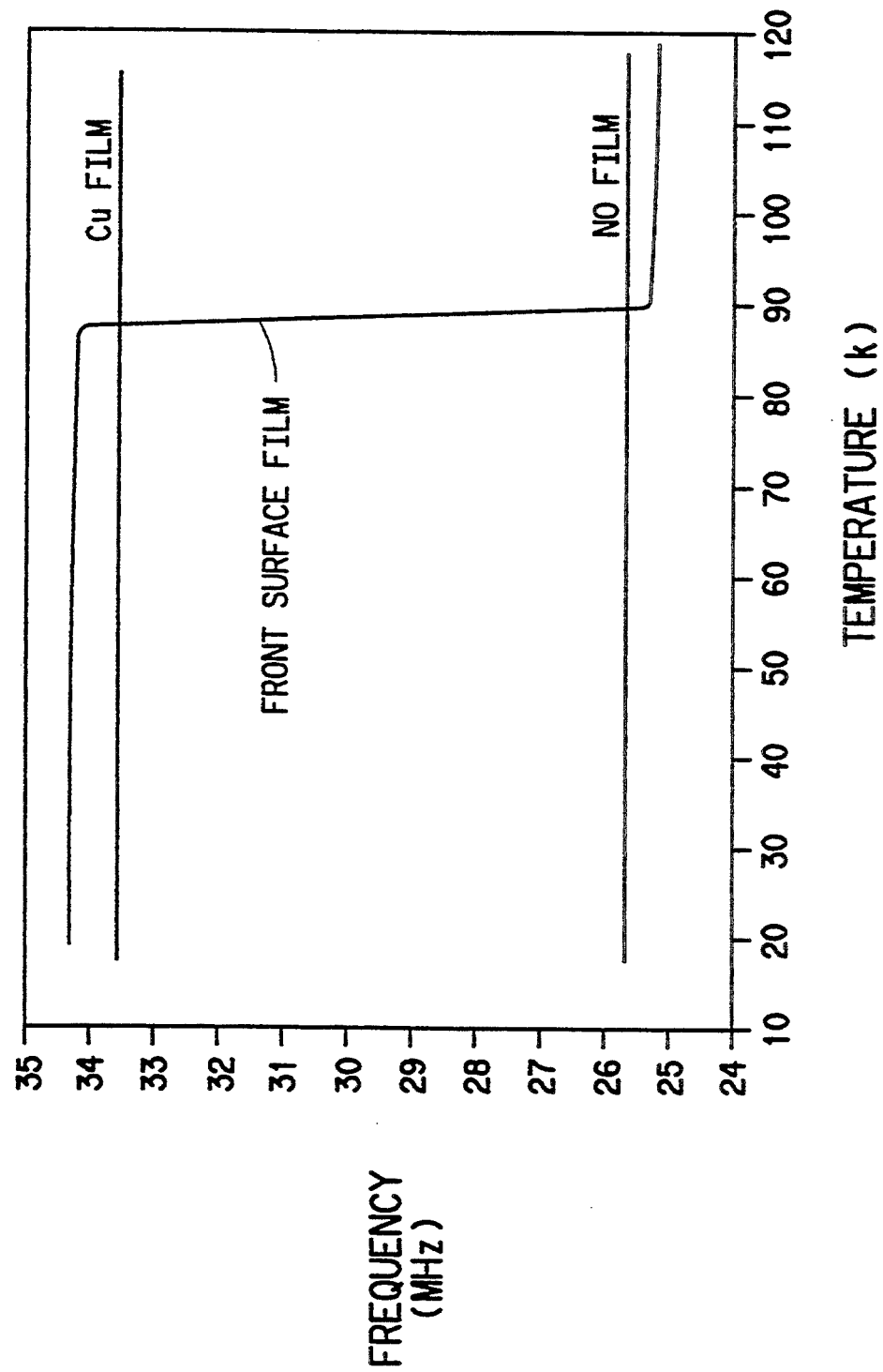

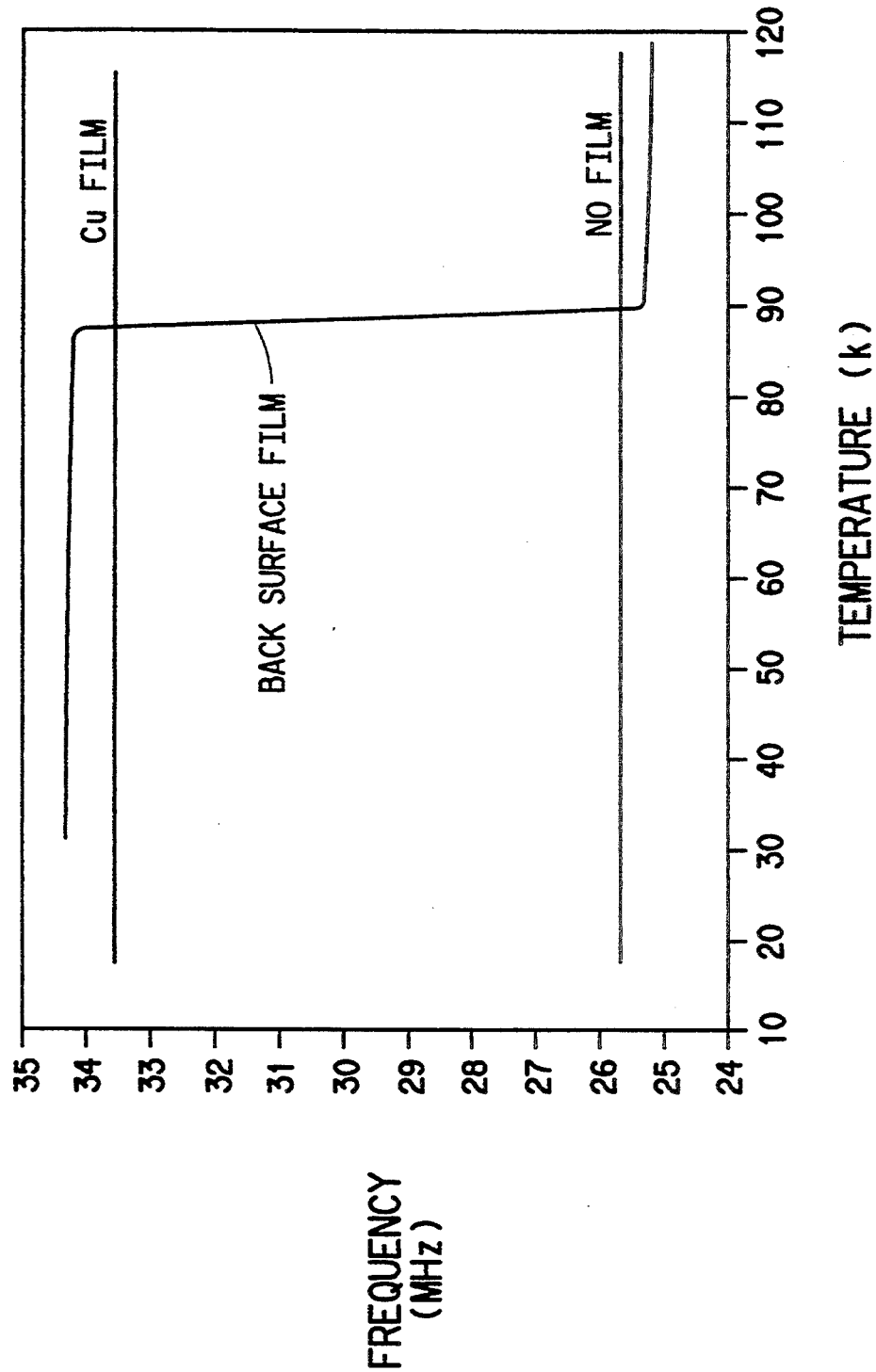

PROCESS FOR DEPOSITING HIGH TEMPERATURE SUPERCONDUCTING OXIDE THIN FILMS

This is a continuation-in-part of application Ser. No. 07/894,983, filed Jun. 8, 1992, which is a continuation of application Ser. No. 624,435, filed Dec. 7, 1990, both now abandoned.

FIELD OF THE INVENTION

This invention relates to a process for producing thin films of high temperature superconducting oxides and other materials requiring high growth temperatures.

BACKGROUND OF THE INVENTION

The discovery of superconductivity at temperatures above 77 K, the boiling point of liquid nitrogen, in oxides such as $YBa_2Cu_3O_{7-x}$ has stimulated a great deal of work over the past four years. Examples of other high temperature superconducting copper oxides which have been discovered during this period are the various Bi-based copper oxides, the various Tl-based copper oxides, the mixed Bi-Tl-based copper oxides and these superconducting oxides substituted with Pb and other substituents.

Much of the work relating to the use of these high temperature superconductors (HTSC) in microelectronic applications has been focused on the growth of high quality thin films. At microwave frequencies, 1–100 GHz, high quality superconducting thin films can have significantly lower values of surface resistance than copper or gold films. This low surface resistance is important for making high-performance thin film microwave circuits such as filters, resonators, and delay lines.

HTSC thin-films have been prepared by a number of deposition methods including evaporation, sputtering, laser ablation, and metallo-organic chemical vapor deposition (MOCVD), see, for example, R. W. Simon, Solid State Technology, p. 141, September, 1989 and J. Talvacchio et al., SPIE Proceedings Vol. 1292, published by SPIE Bellingham, Wash., (1990). In all of the thin film deposition processes for HTSC oxide materials, the substrate temperature is a critical parameter in determining the film quality. When the temperature of the substrate onto which the thin film of $YBa_2Cu_3O_{7-x}$ is being deposited is low, i.e., less than about 400° C. the resulting film is amorphous and insulating. A high-temperature post-deposition anneal at 800°–900° C. in oxygen is required to convert the amorphous precursor film into a superconducting film with the correct crystal structure. This two-step process is referred to as a "post-anneal" process. However, under proper deposition conditions when a thin-film of $YBa_2Cu_3O_{7-x}$ is deposited on a hot substrate, i.e., one at a temperature of about 550°–750° C., the resulting thin-film is crystalline and superconducting directly as deposited. This process is referred to as an "in-situ" process. Films produced by an in-situ process have less surface roughness and generally superior properties when compared to films from a post anneal process. The in-situ deposition process has the added advantage of lower processing temperature requirements which makes the process compatible with a wider variety of substrate materials. In-situ processes based on laser ablation and sputtering have been found to produce high quality thin films of $YBa_2Cu_3O_{7-x}$ on various substrates.

All in-situ processes require a method of heating substrates uniformly and reproducibly to the required deposition temperature. At the present time, the best methods for $Y_1Ba_2Cu_3O_{7-x}$ thin films involve direct thermal and mechanical anchoring of the substrates to a heated block as discussed in R. W. Simon, SPIE Proceedings Vol. 1187, p 2, edited by T. Venkatesan, published by SPIE Bellingham, Wash., (1989). The heated block must be made of a material that is compatible with an oxygen atmosphere and has good thermal conductivity such as nickel. Simple mechanical clamping of the substrates to the block has proven to be unreliable and is not particularly useful for large area substrates because of substrate breakage. Good thermal contact between the substrate and the block is usually provided by a compound with high thermal conductivity such as silver paste. However, this introduces the complication of removing the paste from the back of the substrate usually by polishing or etching. In addition, the direct thermal contact method is not compatible with the deposition of an in-situ film on both sides of the substrate. The thermal contacting compound can interact with the film on the back surface of the substrate and the compound is difficult to remove without damaging the film underneath.

Yoshida et al., U.S. Pat. No. 5,206,216, disclose a process for forming a superconducting oxide film on a tape-type long base material. The base material is translated along its longitudinal direction and laser ablation is used to deposit the oxide film onto the moving base material. The base material is heated by radiant heat during the deposition. It is reported that it is possible to form a high-quality film only on a region of about 2 $cm^2$ by laser deposition and therefore a restrictive mask is used to limit the area of deposition in order to form such a high-quality film.

The ability to deposit high quality superconducting thin films on both sides of a substrate is important for certain microwave circuit applications in order to improve performance and reliability. The film on one side of the substrate would serve as the ground plane while the film on the other side would be patterned into a microwave circuit. This invention provides a non-contact method of heating large area substrates to elevated temperatures for the purpose of depositing crystalline thin films of compounds, particularly films of high temperature superconducting oxides, requiring elevated growth temperatures on one or both sides of the substrate.

SUMMARY OF THE INVENTION

This invention provides a process for in-situ depositing a crystalline thin film of a high temperature superconducting oxide onto a surface of a single crystal substrate having a front surface and a back surface comprising exposing the back surface of said substrate to direct radiation from a radiant heat source to heat said substrate to a growth temperature of said superconducting oxide, and, while maintaining said radiation, sputtering said thin film onto said front surface, wherein the area of said film exceeds 6 $cm^2$. The process is useful for depositing a compound requiring a growth temperature of about 100° C. to 900° C., in particular of about 500° C. to about 900° C. and therefore is especially useful for depositing a film of an oxide, e.g., a high temperature superconducting oxide. The process comprises exposing the back surface of the substrate, i.e., the surface of the substrate opposite the surface on which the thin film is deposited, to radiation from a direct radiant heat source thereby heating the substrate to the desired growth temperature and maintaining the radiation (and thereby the desired growth temperature) during the deposition of the thin film.

The present invention further comprises a process for deposition of crystalline thin films, in particular high temperature superconducting oxide films, onto both the front and back of a substrate. The invention provides a process for in-situ depositing a first crystalline thin film onto a back surface of a single crystal substrate, and a second thin film onto a front surface of said substrate, said crystalline thin films being the same or different and comprised of high temperature superconducting oxides, said process comprising (a) forming a crystalline thin film of a first superconducting oxide on the back surface of said substrate, (b) exposing said thin film formed in (a) on the back surface of the substrate to direct radiation from a radiant heat source thereby heating said substrate to the growth temperature of a second superconducting oxide, and, while maintaining said radiation, depositing by sputtering a second thin film of said second superconducting oxide on the front surface of the substrate, wherein the area of said film deposited on the front surface exceeds 6 cm$^2$.

When the substrate is transparent to the radiation of the radiant heat source, the back surface of the substrate is coated with a layer of material to absorb the radiation prior to the exposure to the radiation. This absorbing material can be the same compound as that of the thin film prepared in-situ using the process of this invention. This invention thus provides a process for preparing thin films of compounds requiring elevated growth temperatures, e.g., high temperature superconducting oxides, on opposite sides of a substrate. The two thin films can be of the same compound. Superconducting films on both sides of a planar substrate would be especially useful for certain microwave applications with one plane serving as the ground plane and the other patterned to form one or more elements of a microwave circuit. The thin film on the back surface of the substrate is deposited first and can be deposited by any method, e.g., by sputtering, laser ablation, evaporation, metallo-organic chemical vapor deposition, spray pyrolysis or any other technique. The film on the other surface of the substrate, i.e., the front surface of the substrate, is deposited using the in-situ method of this invention.

The present invention further comprises a substrate having one or more crystalline thin films deposited thereon prepared according to the above described processes.

BRIEF DESCRIPTION OF THE DRAWINGS

FIG. 2 shows the measured superconducting transition for YBa$_2$Cu$_3$O$_{7-x}$ films on the front and back surfaces of a 1 inch$^2$ (6.25 cm$^2$) area LaAlO$_3$ substrate. A indicates the front surface of the film of the present invention, B indicates a Cu film, and C indicates no film.

DETAILED DESCRIPTION OF THE INVENTION

Figure 1:
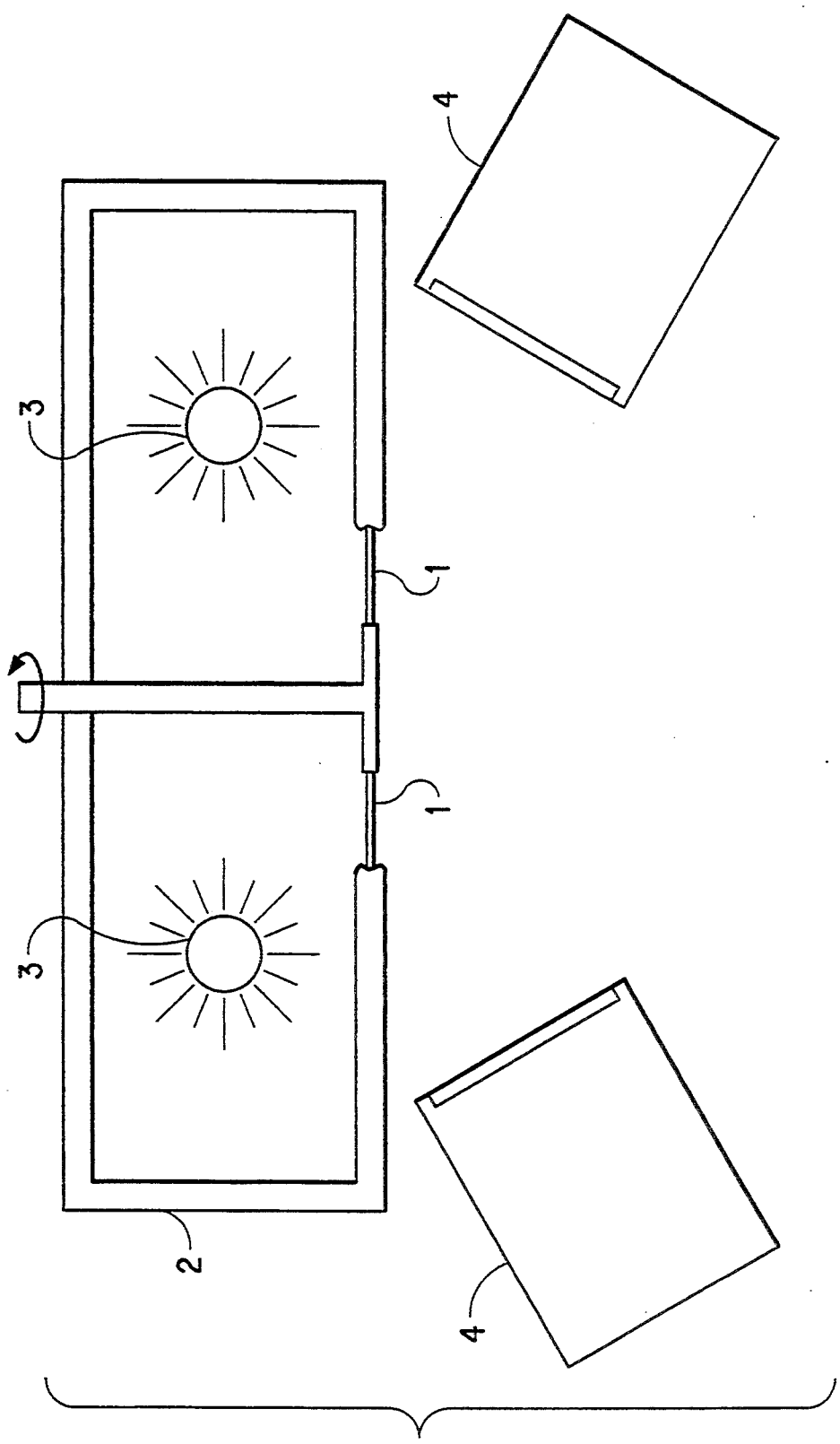
FIG. 1 is a schematic drawing showing one way of practicing the in-situ process of the present invention. A indicates the front surface of the film of the present invention, B indicates a Cu film, and C indicates no film.

For brevity, the surface of the substrate on which the thin film is deposited by the in-situ process of the present invention will be referred to herein as the "front surface" of the substrate. The opposite surface of the substrate will be referred to herein as the "back surface" of the substrate.

Many oxides are compounds which can be deposited by the method of this invention. Of particular interest are the high temperature superconducting oxides such as MBa$_2$Cu$_3$O$_{7-x}$, wherein M is Y or a rare earth metal and x is from about 0 to 0.3, the various Bi-based copper oxides, the various Tl-based copper oxides, the mixed Bi-Tl-based copper oxides and these superconducting oxides substituted with Pb and other substituents.

The substrate can be any substrate suitable for the growth of the particular compound. Unit cell parameters, thermal expansion and lack of reaction with the compound are considerations that must be addressed in choosing a substrate. Substrates used successfully with other processes for the deposition of a particular compound will be useful for the deposition of crystalline thin films of the same compound using the process of the invention.

The substrate is heated by directly exposing the back surface of the substrate to radiation from a radiant heat source such as a quartz halogen lamp, a hot filament of Pt or Pt/Rh or commercially-available heater rods. The radiant source must be compatible with the deposition conditions. The source and the substrate must be positioned so that the proper amount of radiation impinges upon and is absorbed by the substrate thereby raising the temperature of the substrate to a temperature at which growth of the compound will occur.

It is highly desirable to make a large area, uniform, high-quality crystalline film of a high temperature superconducting oxide for use in microelectronic applications. Large area is used herein to describe films of area exceeding 6 cm$^2$. In order to produce large area films which are essentially uniform throughout the film it is necessary to provide essentially identical growth conditions for all areas of the superconducting oxide film. Such films can be prepared by exposing the back surface of the single crystal substrate to direct radiation from a radiant heat source and, while maintaining the radiation, sputtering the superconducting oxide film onto the front surface of the substrate. A high-quality superconducting oxide film which is essentially uniform throughout the film can be produced with an area of 176 cm$^2$ or more by this process. Epitaxial growth of the superconducting oxide film is essential to producing a high-quality uniform film. Substrates such as LaAlO$_3$, MgO, sapphire, NdGaO$_3$ and yttria stabilized zirconia are used for epitaxial growth of high temperature superconducting oxides. It can be advantageous to epitaxially deposit a buffer layer of cerium oxide, magnesium oxide or a rare earth oxide on the front surface of the substrate before depositing the superconducting oxide. This buffer layer between the substrate and the superconducting oxide can help enhance epitaxial growth of the superconducting oxide and/or eliminate any detrimental chemical interaction between the substrate and the superconducting oxide. The term "single crystal substrate" as used herein includes substrates with or without epitaxial buffer layers.

One measure of the uniformity of the superconducting oxide film is $T_c$, the temperature of onset of superconductivity. The term "uniform" as used herein indicates a variation in $T_c$ from the average $T_c$ of no more than ±2 K over the film, preferably no more than ±1 K over the film.

Many common substrates such as sapphire and quartz which are used for thin film growth are transparent to the radiation from a radiant heat source. Therefore, prior to heating and film growth, it is necessary to coat the back surface of a transparent substrate with a radiation absorbing layer to absorb the radiation. Any material that absorbs the radiation can be used, although it is preferred to use a material having the same emissivity as that of the thin film compound to be deposited on the front surface of the substrate.

This invention also provides, for the first time, a process for depositing crystalline thin films on two sides of a substrate with the crystalline thin films being comprised of the same or different compounds requiring elevated growth temperatures. The process comprises the following steps. A crystalline thin film of the desired compound is formed on one surface of the substrate, referred to herein as the back surface. The thin film can be deposited by any method, e.g., by sputtering, laser ablation, evaporation, metallo-organic chemical vapor deposition, spray pyrolysis or any other technique. One preferred method is to expose the front surface of the substrate to direct radiation from a radiant heat source to heat the substrate to a predetermined growth temperature of the desired compound, and while maintaining the radiation, sputtering the compound onto the back surface to form an in-situ crystalline film. The back surface of the substrate containing the thin film is then exposed to radiation from a radiant heat source thereby heating the substrate to the desired growth temperature of the desired compound of the second thin film to be formed on a second or front surface of the substrate and this exposure is maintained during the deposition of the second thin film so that the temperature of the substrate is maintained at the desired growth temperature. This second thin film is preferably deposited by sputtering. The two thin films can both be comprised of superconductoring compounds, high temperature superconducting compounds or the same high temperature superconducting compound.

FIG. 1 is a schematic drawing showing one way of practicing the in-situ process of the invention. In this embodiment, there is provision for depositing thin films on two substrates simultaneously. The two substrates 1 are placed in substrate holding openings in an enclosure 2 containing a radiant heat source 3, one for each substrate. If the substrates are transparent to the radiation from the radiant heat sources, absorbing layers will have been deposited on the back surface of each substrate before they are placed in the enclosure 2, and the substrates are placed in the holders so that the sides of the substrates with the absorbing layers are facing the radiant heat sources. Off-axis sputtering from two sputtering guns 4 is the method of deposition shown in the figure, although any deposition technique could be used. Means are provided to rotate the radiant heat source and substrate holder 2. The components shown in FIG. 1 are situated in a vacuum system in order to carry out sputtering.

The in-situ growth of a thin film of the high temperature superconducting oxide $MBa_2Cu_3O_{7-x}$, wherein M is Y or a rare earth metal and x is from about 0 to 0.3, can be carried out as follows. Single crystal $LaAlO_3$ substrates are preferred and are prepared by depositing a radiant heat absorbing layer on the back surface of the substrate. One choice for the absorbing layer is a thin film, about 1 μm thick, of $MBa_2Cu_3O_{7-x}$. It is not essential that this absorber layer film be $MBa_2Cu_3O_{7-x}$ since any material that absorbs radiant heat from radiation source without degradation would be acceptable. This choice, however, enables the production of a planar substrate with $MBa_2Cu_3O_{7-x}$ thin films on both sides. The first $MBa_2Cu_3O_{7-x}$ film is deposited on the back surface of the substrate, the surface of the substrate to be directly exposed to the radiation from the radiant heat source. This film can be prepared by any technique. For example, a thin film of $YBa_2Cu_3O_{7-x}$ can be deposited by co-evaporation of Y, $BaF_2$, and Cu in the Y:Ba:Cu atomic ratio of 1:2:3 followed by a wet $O_2$ anneal at 800°–850° C. as described by P. M. Mankiewich et al., Appl. Phys. Lett. 51, 1753 (1987). Films produced with this technique have transition temperatures, $T_c$'s, of 91–92 K and low microwave surface resistance, i.e., ten times lower than Cu at 80 K and 20 GHz. Two substrates, each with a thin film of $YBa_2Cu_3O_{7-x}$ on the back surface, are then loaded into the substrate holder as shown in FIG. 1. Quartz halogen lamps are the preferred radiant heat sources when depositing films of $MBa_2Cu_3O_{7-x}$ because these lamps are particularly well suited for operation in the high pressures of oxygen which are useful in growing the $MBa_2Cu_3O_{7-x}$ films. The substrates are heated up to about 700° C. with the quartz lamps. For deposition by sputtering, off-axis sputtering using two sputter guns is preferred, as shown in FIG. 1. Each sputter gun contains a sputtering target of stoichiometric $YBa_2Cu_3O_{7-x}$.

The onset of superconductivity $T_c$ in super-conducting films can determined by using an ac circuit to detect inductance changes in a sensing coil which is inductively coupled to the sample. The transition from a non-superconducting state to a superconducting state is detected by slowly varying the temperature and monitoring the resonant frequency. When the sample passes through the transition, a rapid change in the resonant frequency occurs and the transition temperature can be determined.

EXAMPLE 1

A planar substrate with $YBa_2Cu_3O_{7-x}$ thin films deposited on both sides was prepared in the following manner. A 1 inch$^2$ (6.25 cm$^2$) [100] oriented single crystal $LaAlO_3$ substrate 0.5 mm thick was cleaned by the following process. The substrate was flooded with trichlorotrifluoroethane and methanol and scrubbed with a textured cloth. It was then spray rinsed with deionized water and dried with nitrogen. The substrate was next soaked in sulfuric acid for 10 minutes and then immersed in a water bath. The substrate was then rinsed with isopropanol, spray rinsed with de-ionized water and blow-dried with clean filtered nitrogen.

$LaAlO_3$ was transparent to the radiation used to heat the substrate and it was therefore necessary to deposit an absorbing layer on the back surface of the substrate. In order to produce a substrate with $YBa_2Cu_3O_{7-x}$ thin films on both sides, the absorbing material used was $YBa_2Cu_3O_{7-x}$ and it was formed as follows. The cleaned substrate was loaded into a turbomolecular pumped vacuum chamber with a base pressure of less than $8 \times 10^{-7}$ mbar ($8 \times 10^{-5}$ Pa). Y, $BaF_2$ and Cu were co-evaporated onto the unheated $LaAlO_3$ substrate at the appropriate rates to give an atomic ratio of Y:Ba:Cu of 1:2:3 in the deposited film. The total deposition rate at the substrate was about 2 Å/sec (0.2 nm/sec). Y and Cu were electron-beam evaporated from separate guns and the rates were controlled with Leybold-Heraeus Inficon Sentinel III electron impact emission sensors. $BaF_2$ was thermally evaporated from a covered molybdenum boat and the rate was controlled with a quartz crystal evaporation monitor. The co-evaporation was carried out in the presence of oxygen at $1 \times 10^{-5}$ mbar ($1 \times 10^{-3}$ Pa). The total film thickness was about 4500 Å (450 nm). The substrate containing the evaporated film was then placed in a standard quartz-lined tube furnace. The furnace was heated to 850° C. at a rate of about 25° C./min and the film was in wet oxygen, formed by bubbling oxygen through de-ionized water. The temperature was maintained at 850° C. for 30 minutes, and the film was then cooled in dry oxygen at a rate of about 5° C./min to about 500° C. and then furnace cooled to room temperature (about 20° C.).

The $LaAlO_3$ substrate with the $YBa_2Cu_3O_{7-x}$ film on the back surface was then loaded into a cyro-pumped vacuum sputter deposition system [Leybold model L560] with a radiant heater and substrate holder configuration as schematically shown in FIG. 1. The substrate was placed with the $YBa_2Cu_3O_{7-x}$ film on the back surface directly exposed to the radiant heat source, a quartz halogen lamp. The internal temperature of the heater was measured with a thermocouple. The output of the internal thermocouple provided a feedback signal for a standard temperature controller which controlled the power to the quartz lamps. This sputtering system was equipped with two rf magnetron sputtering guns with a 3" (7.6 cm) diameter $YBa_2Cu_3O_{7-x}$ target in each gun. The guns were oriented in an "off-axis" configuration to reduce negative ion bombardment effects on the substrates. The substrate temperature was raised to about 700° C. at a rate 15° C./min. and maintained at this temperature during the deposition of the film by sputtering. The cryo-pump was throttled to reduce its pumping speed, and a gas flow of Ar (180 sccm, i.e, 180 standard cubic centimeters/minute) and $O_2$ (40 sccm) was used to raise the system pressure to 200 mtorr (26.7 Pa). The rf sputter guns were operated with 100 watts of rf power going to each of the two guns. This resulted in a deposition rate of about 250 Å/hr (25 nm/hr) at the substrate. The total deposition time was about 3 hours. The rf power and gas flow was turned off. The system was then backfilled with pure $O_2$ at a pressure of 200 torr ($2.67 \times 10^4$ Pa), and the substrate was cooled to room temperature at a rate of 15° C./min. The substrate was then removed from the system. The product was a substrate with $YBa_2Cu_3O_{7-x}$ thin films on both sides.

The inductively measured superconducting transition of the film produced by the in-situ method of this invention is shown in FIGS. 2A and 2B. In FIG. 2A, A indicates the front surface of the film of the present invention, B indicates a Cu film and C indicates no film. The value of $T_c$, about 90 K, as well as the narrow 1–2 K width of the superconducting transition indicated a very high quality film. The film on the back surface of this substrate also had a $T_c$ of about 90 K and a very narrow superconducting transition as shown in FIG. 2B. In FIG. 2B, A indicates the back surface of the film of the present invention, B indicates a Cu film, and C indicates no film. The fact that the film on the back surface of the substrate was not degraded by the heating process shows that this technique can be used to produce high quality in-situ grown films on both sides of a $LaAlO_3$ substrate.

EXAMPLE 2

A [001] oriented single crystal yttria stabilized zirconia (YSZ) substrate having a 3 inch (7.62 cm) diameter and a 45.6 cm² area and a thickness of 0.5 mm was obtained from Ceres Corp. [Billerica, Mass.] and cleaned using essentially the method described in Example 1. After cleaning, the substrate was loaded into the same deposition chamber used in Example 1. This deposition chamber had a third rf magnetron sputtering source with a 3 inch (7.62 cm) diameter $CeO_2$ sputtering target. The substrate holder was designed to hold the substrate only by the edges and allow direct backside heating of the entire 3-inch (7.62 cm) diameter substrate. No backside absorber layer was used in this case since the YSZ substrate material has been found to be more absorbing than $LaAlO_3$. The substrate temperature was raised to about 700° C. at a rate of 15° C./rain and maintained at this temperature during the deposition of the film by sputtering. The cryo-pump was throttled to reduce its pumping speed, and a gas flow of Ar (121 sccm) and $O_2$ (37.5 sccm) was used to raise the system pressure to 150 mtorr (20 Pa). A [001] oriented 500 Å (50 nm) thick $CeO_2$ buffer layer was grown on the surface of the YSZ substrate by off-axis rf magnetron sputtering using the $CeO_2$ sputter source operating at an rf power of 100 watts for a period of 1 hour. Immediately after the deposition of the $CeO_2$ was complete, the $CeO_2$ source was turned off and the Ar gas flow was decreased to 85 sccm while the $O_2$ gas flow was increased to 85 sccm. The pressure was kept constant at 150 mtorr (20 Pa) and the substrate temperature was kept constant at about 700° C. After adjusting the gas flow, 50 watts of dc power was applied to each of the two $YBa_2Cu_3O_{7-x}$ sputter sources. The total deposition time for the $YBa_2Cu_3O_{7-x}$ film was 900 minutes. After the $YBa_2Cu_3O_{7-x}$ deposition was complete, the dc power and gas flow were turned off. The system was then back filled with pure $O_2$ to a pressure of 200 torr ($2.67 \times 10^4$ Pa), and the substrate was cooled to room temperature at a rate of 5° C./min. The substrate was then removed from the system. The product is a 3-inch (7.62 cm) diameter, 45.6 cm² area YSZ substrate with a uniform $CeO_2$ buffer layer film and a uniform $YBa_2Cu_3O_{7-x}$ film on top of the buffer layer. The inductively measured superconducting transition for this film was 90 K ±1 K, very sharp (1–2 K wide), and uniform to within ±1 K over the 3-inch (7.62 cm) diameter, 45.6 cm² area film.

EXAMPLE 3

An r-plane oriented single crystal sapphire substrate with a 3-inch (7.62 cm) diameter, 45.6 cm² area and a thickness of 0.5 mm was obtained from Union Carbide Corp. [Washougal, Wash.] and cleaned using essentially the method described in Example 1. After cleaning, the backside of the substrate was coated with a 1 μm thick film of 80/20 Ni/Cr alloy to act as an absorber layer. The NiCr film was deposited using a standard e-beam evaporation system [Leybold model L560]. After preparation of the NiCr absorber layer, the substrate was loaded into the same deposition chamber used in Examples 1 and 2. This deposition chamber has a third rf magnetron sputtering source with a 3-inch (7.62 cm) diameter $CeO_2$ sputtering target. The substrate holder was designed to hold the substrate only by the edges and allow direct backside heating of the entire 3-inch (7.62 cm) diameter substrate. The substrate temperature was raised to about 700° C. at a rate of 15° C./min and maintained at this temperature during the deposition of the film by sputtering. The cryo-pump was throttled to reduce its pumping speed, and a gas flow of Ar (121 sccm) and $O_2$ (37.5 sccm) was used to raise the system pressure to 150 mtorr (20 Pa). A [001] oriented 500 Å (50 nm) thick $CeO_2$ buffer layer was grown on the surface of the sapphire substrate by off-axis rf magnetron sputtering using the $CeO_2$ sputter source operating at an rf power of 100 watts for a period of 1 hour. Immediately after the deposition of the $CeO_2$ was complete, the $CeO_2$ source was turned off and the Ar gas flow was decreased to 85 sccm while the $O_2$ gas flow was increased to 85 sccm. The pressure was kept constant at 150 mtorr (20 Pa) and the substrate temperature was kept constant at about 700° C. After adjusting the gas flow, 50 watts of dc power was applied to each of the two $YBa_2Cu_3O_{7-x}$ sputter sources. The total deposition time for the $YBa_2Cu_3O_{7-x}$ film was 900 minutes. After the $YBa_2Cu_3O_{7-x}$ deposition was complete, the dc power and gas flow were turned off. The system was then backfilled with pure $O_2$ to a pressure of 200 torr ($2.67 \times 10^4$ Pa), and the substrate was cooled to room temperature at a rate of 5° C./min. The substrate was then removed from the system. The product is a 3-inch (7.62 cm) diameter, 45.6 $cm^2$ area sapphire substrate with a uniform $CeO_2$ buffer layer film and a uniform $YBa_2Cu_3O_{7-x}$ film on top of the buffer layer. The inductively measured superconducting transition for this film was 83 K±1 K, very sharp (1–2 K wide), and uniform to within ±1 K over the 3-inch (7.62 cm) diameter, 45.6 $cm^2$ area film.

What is claimed is:

1. A process for in-situ depositing a uniform crystalline thin..film of a high temperature superconducting oxide onto a surface of a single crystal substrate having a front surface and a back surface comprising exposing said back surface to direct radiation from a radiant heat source to heat the substrate to a growth temperature of said superconducting oxide, and, while maintaining the radiation, sputtering the thin film onto the front surface, wherein the area of said film simultaneously deposited exceeds 6 $cm^2$ and the variation in $T_c$ from the average $T_c$ is plus or minus 2 K over the area of said film.

2. The process of claim 1 wherein said growth temperature is about 500° C. to about 900° C.

3. The process of claim 2 wherein said high temperature superconducting oxide is $MBa_2Cu_3O_{7-x}$, wherein M is Y or a rare earth metal and x is from about 0 to 0.3.

4. The process of claim 1 wherein said back surface of the substrate is coated with a layer of material to absorb said radiation prior to said exposure.

5. The process of claim 4 wherein said growth temperature is about 500° C. to about 900° C.

6. The process of claim 5 wherein said high temperature superconducting oxide is $MBa_2Cu_3O_{7-x}$, wherein M is Y or a rare earth metal and x is from about 0 to 0.3.

7. The process of claim 6 wherein said substrate is comprised of a single crystal of $LaAlO_3$.

8. A process for in-situ depositing a first uniform crystalline thin film onto a back surface of a single crystal substrate, and a second uniform thin film onto a front surface of said substrate, said crystalline thin films being the same or different and comprised of high temperature superconducting oxides, said process comprising the steps of
   (a) forming a crystalline thin film of a first superconducting oxide on the back surface of the substrate, and
   (b) exposing said thin film formed in (a) on the back surface of the substrate to direct radiation from a radiant heat source thereby heating the substrate to the growth temperature of a second superconducting oxide, and, while maintaining said radiation, depositing by sputtering a second thin film of said second superconducting oxide on the front surface of the substrate, wherein the area of said film deposited on the front surface exceeds 6 $cm^2$ and the variation in $T_c$ from the average $T_c$ is a maximum of plus or minus 2 K over the area of said film.

9. The process of claim 8 wherein the substrate is planar and said thin films are deposited on opposite sides of said planar substrate.

10. The process of claim 8 wherein said growth temperature is about 500° C. to about 900° C.

11. The process of claim 10 wherein said first and second high temperature superconducting oxides are the same high temperature superconducting oxide.

12. The process of claim 11 wherein said high temperature superconducting oxide is $MBa_2Cu_3O_{7-x}$, wherein M is Y or a rare earth metal and x is from about 0 to 0.3.

13. The process of claim 12 wherein said substrate is comprised of a single crystal of $LaAlO_3$.

14. The process of claim 8 wherein said crystalline film of the first superconducting oxide is formed on said back surface of the substrate by exposing the front surface of the substrate to direct radiation from a radiant heat source to heat the substrate to a predetermined growth temperature of the first superconducting oxide, and, while maintaining the radiation, sputtering said first superconducting oxide onto said back surface to form in-situ crystalline film, wherein the area of said crystalline film exceeds 6 $cm^2$.

15. The process of claim 14 wherein both said high temperature superconducting oxides are the same high temperature superconducting oxide.

16. The process of claim 15 wherein said high temperature superconducting oxide is $MBa_2Cu_3O_{7-x}$ wherein M is Y or a rare earth metal and x is from about 0 to 0.3.

* * * * *